United States Patent [19]
Roy

[11] Patent Number: 6,147,872
[45] Date of Patent: Nov. 14, 2000

[54] INJECTOR/EJECTOR MACHANISM FOR PRINTED CIRCUIT CARDS

[75] Inventor: Christopher E. Roy, Plymouth, Mass.

[73] Assignee: Excel Switching Corporation, Hyannis, Mass.

[21] Appl. No.: 09/246,365

[22] Filed: Feb. 8, 1999

[51] Int. Cl.[7] .................................................. H05K 5/00
[52] U.S. Cl. ........................ 361/754; 361/732; 361/798; 361/801; 211/41.17
[58] Field of Search .................................. 361/752, 753, 361/759, 754, 796, 797, 798, 801, 802; 211/41.17; 312/222

[56] References Cited

U.S. PATENT DOCUMENTS

| | | | |
|---|---|---|---|
| 4,648,009 | 3/1987 | Beun et al. | 361/759 |
| 4,996,631 | 2/1991 | Freehauf | 361/798 |
| 5,255,160 | 10/1993 | Iwatare et al. | 361/798 |
| 5,373,133 | 12/1994 | Brockway et al. | 361/801 |
| 5,669,512 | 9/1997 | Joslin | 211/41.17 |
| 5,793,614 | 8/1998 | Tollbom | 361/732 |
| 5,946,196 | 8/1999 | Baek | 361/798 |

*Primary Examiner*—Jayprakash N. Gandhi
*Attorney, Agent, or Firm*—Cesari and McKenna, LLP

[57] ABSTRACT

An injector/ejector mechanism for a printed circuit card of the type that has front, rear and opposite side edges, a face plate at the front edge and a connector at the rear edge of the card in which slides on chassis card guides adjacent to the side edges of the cards to a home position in a chassis which connects that connector to a mating connector on a motherboard in the chassis. The mechanism includes a dog having spaced-apart first and second lobes, and a pivot pivotally connecting the dog to the card adjacent to the front edge thereof whereby the dog can pivot parallel to the card. The dog is pivotable between a first position wherein the first dog lobe overhangs the card side edge and engages a first surface of the card guide when the card is not in its home position and a second position wherein the second lobe overhangs the card side edge and engages a second surface of the card guide behind the first surface when the card is in its home position. A lever arm and drag link are provided for pivoting the dog between its first and second positions. The mechanism requires minimal space on the printed circuit card and a minimal opening in the face plate of the card.

6 Claims, 4 Drawing Sheets

INJECTOR/EJECTOR MACHANISM FOR PRINTED CIRCUIT CARDS

This invention relates to a telecommunication switch. It relates more particularly to an injector/ejector mechanism for printed circuit cards comprising such a switch.

BACKGROUND OF THE INVENTION

A telecommunication switch is used to write message traffic over a network. Usually, it comprises a chassis or housing containing circuitry on a multiplicity of printed circuit cards which slide into the chassis and plug into a motherboard inside the chassis. The various communication lines are plugged into connectors on those cards, the connectors being exposed at the front and/or back of the chassis. The actual switching may be controlled by a central processor unit (CPU) contained on one or more of the cards in accordance with programs and instructions provided from an external keyboard. The chassis usually also contains a power supply for supplying power at various parts of the switch. Examples of such switches are disclosed in U.S. Pat. No. 5,398,161 and pending application Ser. No. 08/936,489, filed Sep. 16, 1997. The contents of said patent and application are hereby incorporated herein by reference.

In the construction of telecommunications switches of this general type, it is customary to incorporate into the switch various latch mechanisms to facilitate the insertion and withdrawal of the printed circuit cards from the switch chassis. Usually, the latches are mounted to opposite sides of each printed circuit card. When the card is slid into the chassis, the latches may be actuated to drive the card to a home position which causes connector(s) at the rear edge of the card to mate with corresponding connector(s) on the motherboard within the chassis. Movement of the latches to an unlocked position disconnects the card from the motherboard so that the card can be slid easily out of the chassis.

The prior printed circuit card injector/ejector mechanisms are disadvantaged in that they occupy a relatively large amount of surface area on the printed circuit card. This reduces the available space on that card for electrical components and printed circuit paths. Resultantly, to give a switch a given switching capacity, either the cards have to be made larger or more cards must be used thereby increasing the overall size of the switch.

The conventional printed circuit cards used in telecommunication switches invariably have metal face plates at the fronts of the cards. When all of the cards are seated properly in the switch chassis, the plates combine to form a front panel which is supposed to provide a shield to minimize the emission of electromagnetic radiation at the front of the switch. However, the prior injector/ejector mechanisms for the printed circuit cards were not designed with this objective in mind because those mechanisms require relatively large openings in the face plates in order to function properly. These openings constitute holes in the electromagnetic shield at the front of the switch through which electromagnetic radiation can escape from the interior of the switch.

SUMMARY OF THE INVENTION

Accordingly, the present invention aims to provide an improved injector/ejector mechanism for printed circuit cards, particularly the cards used in telecommunication switches.

Another object of the invention is to provide a mechanism of this type which requires a minimum amount of real estate on the associated printed circuit card.

A further object of the invention is to provide an injector/ejector mechanism for a printed circuit card which requires only a relatively small opening in the face plate of the card.

Yet another object of the invention is to provide such a mechanism which can be manufactured in quantity relatively easily at minimum cost.

Other objects will, in part, be obvious and will, in part, appear hereinafter. The invention accordingly comprises the features of construction, combination of elements and arrangement of parts which will be exemplified in the following detailed description, and the scope of the invention will be indicated in the claims.

Briefly, my injector/ejector mechanism is for use on a printed circuit card of the type that has front, rear and opposite side edges, a face plate at the front edge and a connector at the rear edge and which is slidable on card guides adjacent to the side edges of the card to a home position inside a chassis which connects the connector to a mating connector on a motherboard in the chassis.

The mechanism includes a dog having spaced-apart first and second lobes and pivot means pivotally connecting the dog to the card adjacent to the front edge thereof whereby the dog can pivot parallel to the card, the dog being pivotable between a first position wherein the first dog lobe overhangs said side edge and engages a first surface of the card guide when the card is not in its home positions and a second position wherein the second dog lobe overhangs said side edge and engages a second surface of the card guide behind the first surface when the card is in its home position. The mechanism also includes means in the form of a lever arm and linkage to move the dog between said two positions.

The injector/ejector mechanism requires only a minimum amount of surface area on the printed circuit card thereby increasing the available space on the card for circuit components. Also, the mechanism requires only a small hole in the card face plate so that electromagnetic emissions through the face plate are kept to a minimum.

As will be seen, the mechanism is easy to operate and composed of relatively few parts which are easy to fabricate in quantity. Therefore, incorporation of the mechanism into the card makes the card user friendly without appreciably increasing the overall cost of the card.

BRIEF DESCRIPTION OF THE DRAWINGS

For a fuller understanding of the nature and objects of the invention, reference should be had to the following detailed description taken in connection with the accompanying drawings, in which.

DETAILED DESCRIPTION OF THE PREFERRED EMBODIMENT

Figure 1:
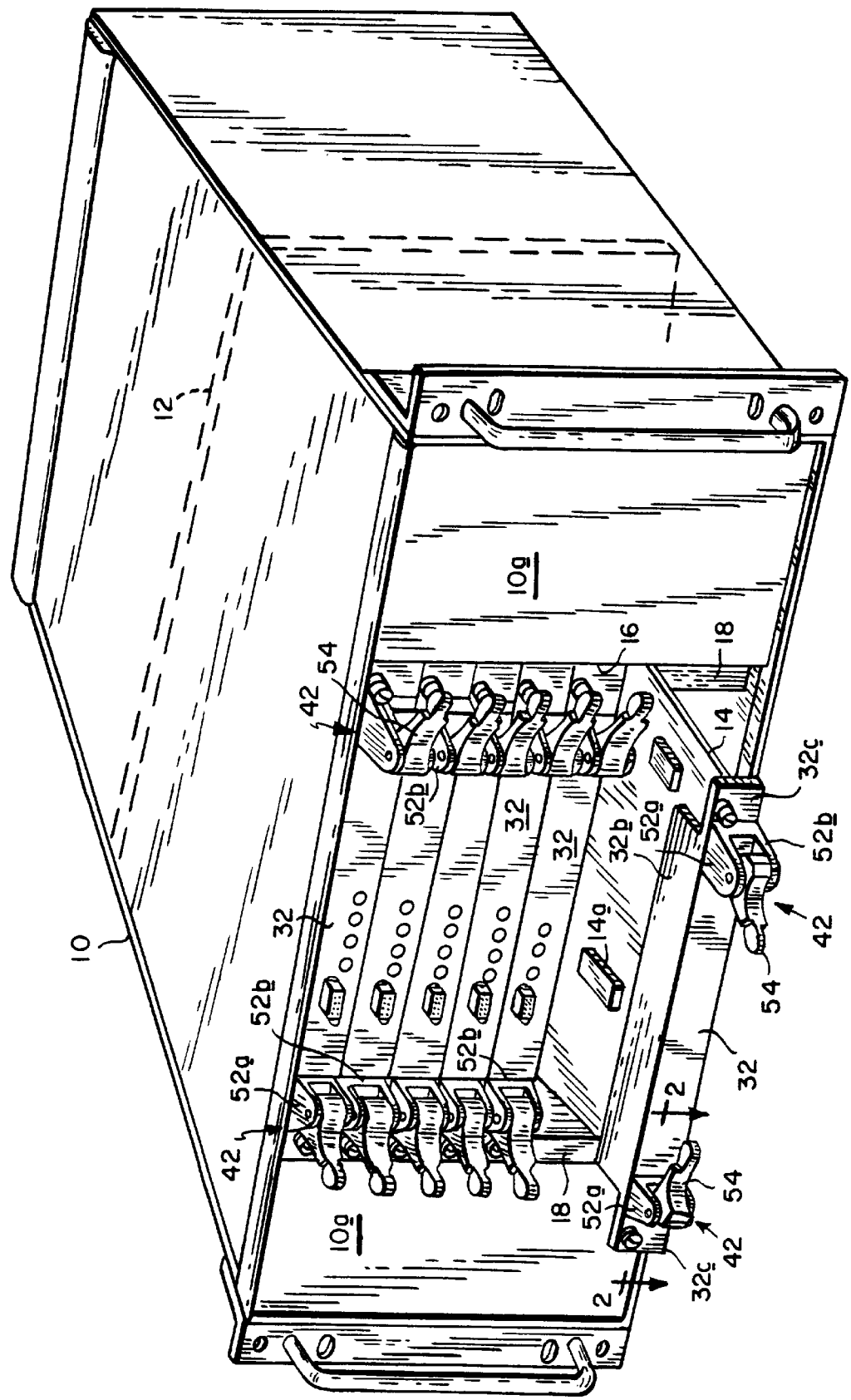
FIG. 1 is a left, front perspective view from above, showing a telecommunications switch composed of printed circuit cards each fitted with two injector/ejector mechanisms according to the invention.
Figure 4A:
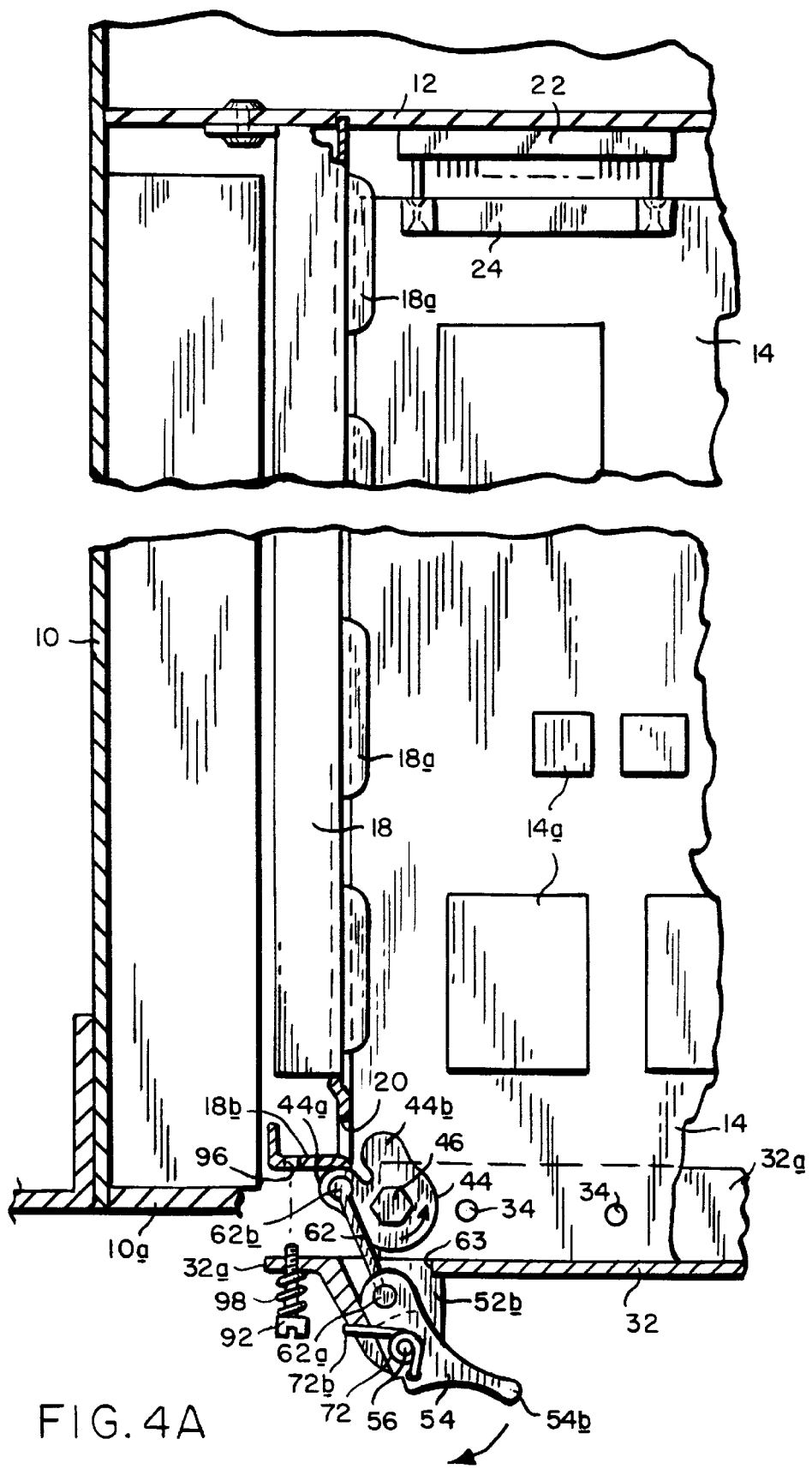
FIGS. 4A and 4B are plan views showing the FIG. 2 mechanism in its unlocked and locked positions, respectively.

Referring to FIG. 1 of the drawings, the telecommunications switch comprises a is generally rectangular housing 10 which contains a motherboard 12 supported on edge within the housing. The motherboard may be located midway back in the housing so that it constitutes a mid-plane. Housing 10 is adapted to contain a multiplicity of printed circuit cards 14. The illustrated cards 14 are arranged in a column or stack and are accessible through a large opening 16 in the front wall 10*a* of the housing. The cards 14 are slidably positioned within the housing by a pair of laterally spaced-apart, mirror-image card guides 18, 18. The card guides extend forwardly from mid-plane 12 to the front of the housing and extend the full height of the housing. As best seen in FIG. 4A, the card guides 18, 18 define columns of slides 18*a* which support the opposite side edges of the printed circuit cards 14. Also, each card guide is formed with a front flange 18*b* and a column of openings 20 adjacent flange 18*b* for reasons that will become apparent.

The motherboard 12 carries printed circuit paths and card connectors 22 which are arranged to connect to mating rear edge connectors 24 on the printed circuit cards supported by the card guides. See the above pending application for details about the card guides and motherboard.

A similar column of printed circuit cards and card guides therefor may be provided at the rear of housing 10 which cards may plug into connectors on the rear face of motherboard 12.

Figure 2:
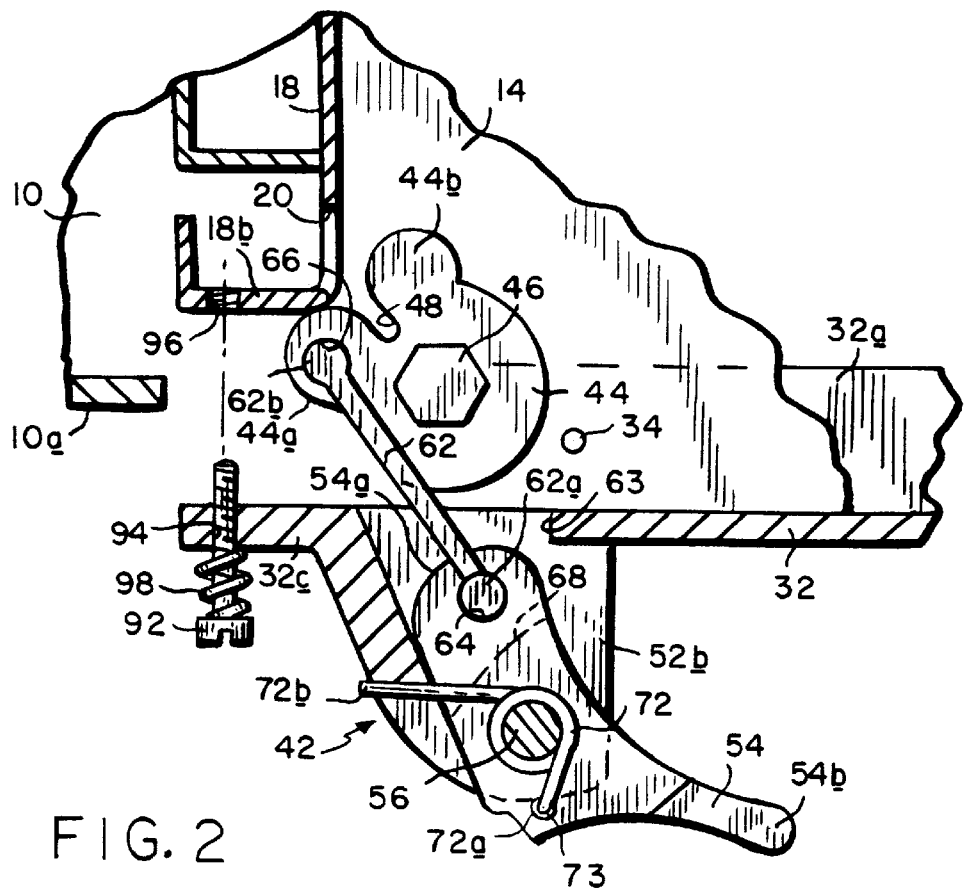
FIG. 2 is a sectional view on a larger scale taken along line 2—2 of FIG. 1.
Figure 3:
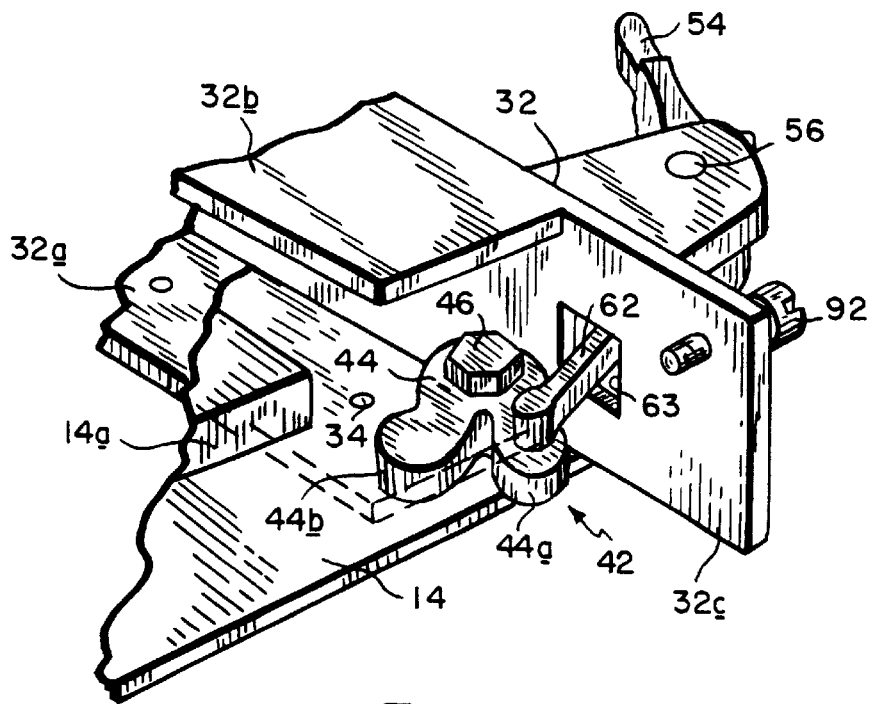
FIG. 3 is a fragmentary rear perspective view showing in greater detail the mechanism depicted in FIG. 2.

As best in FIGS. 1 to 3, each printed circuit card 14 has a metal face plate 32 mounted to the front edge of the card. Each face plate 32 has a generally C-shaped cross section. A lower flange or arm 32*a* of the face plate is connected by fasteners 34 to the associated printed circuit card 14. An upper flange or arm 32*b* of the face plate overhangs that card.

Each face plate 32 also has a pair of mirror-image end extensions 32*c* which project out laterally and overhang the card guides 18, 18 in housing 10. When the printed circuit cards 14 are in their seated positions as shown in the upper portion of FIG. 1, the end extensions 32*c* engage the card guide flanges 18*b* and, together, completely close the opening 16 in the front wall 10*a* of housing 10.

Still referring to FIGS. 1 to 3, associated with each printed circuit card 14 is a pair of mirror-image injector/ejector mechanisms each shown generally at 42. Each such mechanism is located adjacent a side edge of the associated card 14 in the face plate 32 for that card.

The injector/ejector mechanism 42 comprises a small flat dog 44 pivotally connected to the associated printed card 14 by a suitable pivot 46 such as a screw or rivet. Dog 42 is formed with a pair of spaced apart lobes or ears 44*a* and 44*b* which ears are separated by a gap 48. Each lobe or ear 44*b* is rounded and sized to fit through an above-mentioned opening 20 in a card guides 18. Furthermore, the gap 48 is made slightly wider than the thickness of the card guide flange 18*b*. The plate 44 is pivotally connected to the associated card 14 close to a front corner of the card such that the plate lobes 44*a*, 44*b* face the adjacent card guide 18.

Part of each mechanism 42 is mounted to the face plate 32 of the associated printed circuit card 14. More particularly, each face plate 32 is formed with mirror-image pairs of upper and lower parallel ears 52*a* and 52*b* just inboard the face plate end extensions 32*c*. Pivotally connected between each pair of ears 52*a* and 52*b* by an axle 56 is a lever arm 54. As shown in FIGS. 2 and 3, the lever arm 54 is connected by a link 62 to the adjacent dog 44, the link passing through a small hole 63 is face plate 32. Specifically, one end of link 62 is formed with a post 62*a* which is rotatably mounted in a hole 64 adjacent the inner end 54*a* of the lever arm. The other end of link 62 has a post 62*b* which is rotatable within a hole 66 in the lobe 44*a* of the associated dog 44. Thus, when the lever arm 54 is pivoted about the axle 56, the dog 44 is rotated about its pivot 46 to the printed circuit card 14.

Figure 4B:
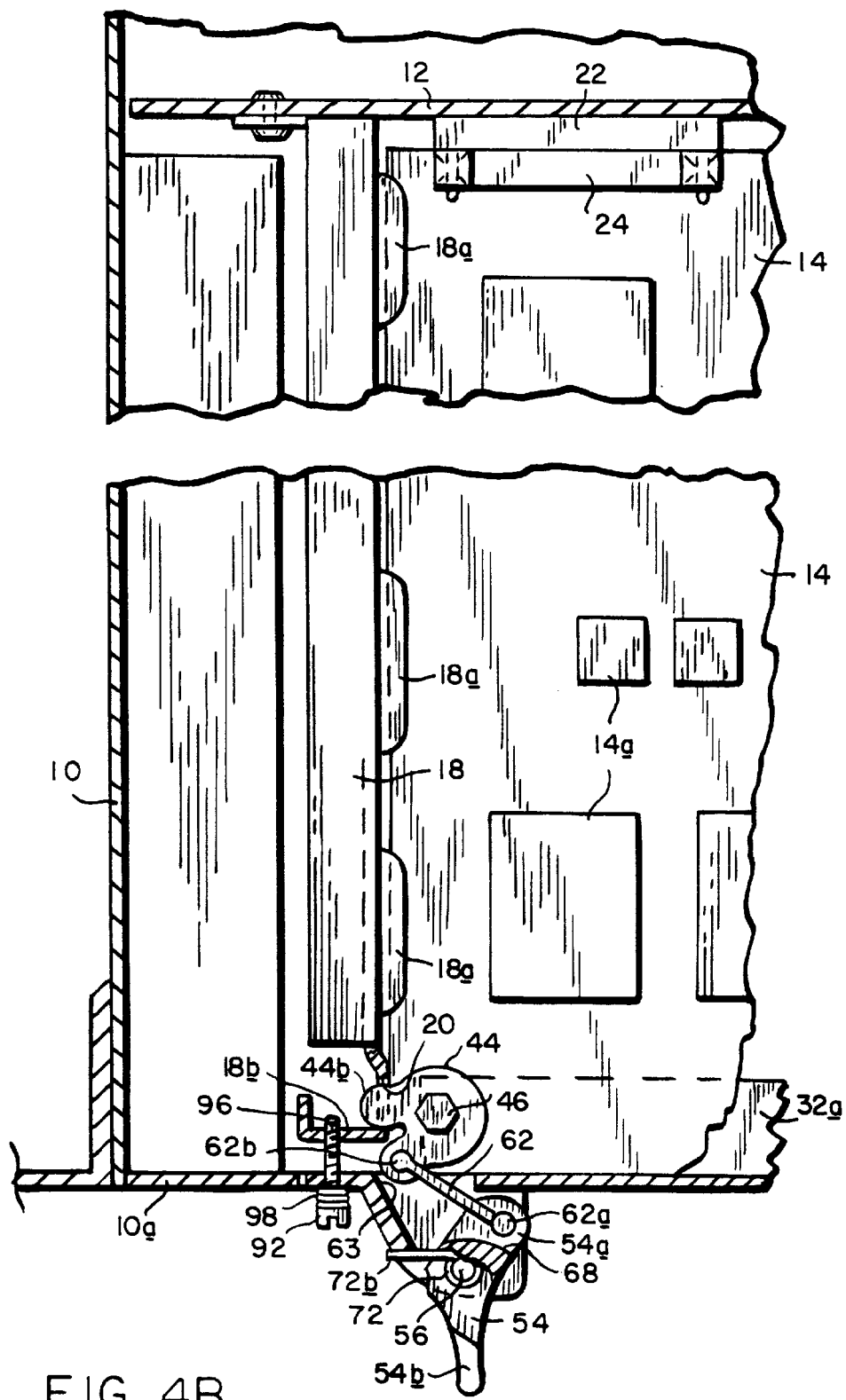

As seen from FIGS. 4A and 4B, each lever arm 54 is swingable about axle 56 between an unlocked position shown in FIG. 4A wherein the outer end 54*b* of the lever arm extends toward the middle of the face plate 32 and a locked position illustrated in FIG. 4B wherein the lever arm end 54*b* extends toward the adjacent end of the face plate. To provide clearance for link 62 when the lever arm 54 is swung between these position, a slot 68 is provided in the end 54*a* of the associated lever arm as shown in FIGS. 2 and 4B.

Also in accordance with the invention, means are provided for biasing each lever arm 54 toward its unlocked position shown in FIG. 4A. More particularly, a coil spring 72 encircles the axle 56 of each lever arm. One end 72*a* of the spring is bent over into a hole 73 (FIG. 2) in the lever arm; the other spring end 72*b* is engaged against one of the ears 52*a*, 52*b* supporting that lever arm.

Refer now to FIG. 4A, the injector/ejector mechanisms 42 come into play when a printed circuit card 14 is slid toward its home position as shown in FIG. 4A. As noted above, the lever arm 54 is normally biased toward its unlocked position which positions the dog lobe 44*a* of each mechanism 42 so that it overhangs the front flange 18*a* of the associated card guide 18. The other dog lobe 44*b* is located inboard the associated card guide. Accordingly, the printed circuit card can be slid into the chassis until the dog lobe 44*a* engages the associated card guide flange 18*b* as shown in FIG. 4A. At this point, the card connector 24 is not yet connected to the corresponding connector 22 of the motherboard 12. Now, the lever arms 54 of that card may be swung outward to the side in the direction shown by the arrow in FIG. 4A. The motion of the lever arm is transferred by the associated link 62 to the corresponding dog 44 which thereupon rotates in the direction shown by the small curved arrow in that figure so that the dog lobe 44*b* is urged toward the associated card guide 18 and into the hole 20 opposite that dog. Further movement of the lever arm outward to the position shown in FIG. 4B rotates the dog 44 even more so that the dog lobe 44*b* engages behind the corresponding card guide flange 18*b*, the gap 48 in the dog providing clearance, thereby jacking card 14 to its fully seated position wherein the card connector 24 mates with the corresponding motherboard connector 22.

When the printed circuit card 14 is seated properly in housing 10, friction forces tend to retain the card in that position despite the fact that the lever arm 54*b* is biased toward its unlocked position. However, to make sure that the card remains seated even when the switch is subjected to vibrations, each card is equipped with a pair of threaded fasteners 92 which extend through holes 94 in the end extensions 32*c* of the card face plate 32. When a card 14 is in its home position, its fasteners 92 may be screwed into threaded holes 96 in the associated card guide flanges 18*b* as best seen in FIG. 4B. Preferably, a coil spring 98 encircles each fastener 92 between the fastener head and the plate extension 32*c*. When the fastener is turned down into its threaded hole 96, the spring takes up any play in the threaded connection to ensure that the printed circuit card remains securely fastened to the switch chassis even when the switch is subject to vibrations.

It is a feature of the invention that each injector/ejector mechanism 42 takes up very little space on the printed circuit card 14 as compared with prior card latching mechanisms of this general type. For example, whereas a typical pair of card latches may take up two square inches of surface area on the printed circuit card, a pair of mechanisms 42 requires only half that amount of real estate. Therefore, more area is available on the card for electrical components and the printed interconnections therefor.

It is also important to note that the mechanisms 42 require only very small, e.g., ⅛ in.×¼ in., holes 63 in the face plate 32 of card 10 to accommodate the movements of links 62. Accordingly, when a full complement of cards 14 is installed in housing 10, the face plates of those cards form a substantially continuous wall which completely closes the opening 16 at the front of the housing. Therefore, when the switch is in operation, emission of electromagnetic radiation from the front of the housing 10 is kept to a minimum.

It will also be appreciated from the foregoing that the injector/ejector mechanism 42 described herein is relatively easy and inexpensive to make in quantity. The mechanisms at opposite sides of a card 14 are mirror-images of one another and their corresponding parts are interchangeable. Furthermore, the major components of the mechanism are simple molded parts which can be fabricated in quantity relatively inexpensively.

When it is necessary to remove one of the cards from housing 10, the fasteners 92 securing that card to the card guides 18 are loosened and the lever arms 54 of that card are swung inward toward one another. This causes the associated dogs 44 to rotate so that the dog lobes 44*b* are retracted from the holes 20 in the associated card guides 18 and the dog lobes 44*a* are pressed against the front flanges 18*b* of the card guides. Continued movement of the lever arms toward their unlocked position shown in FIG. 4A jacks the card 14 outward so that the card connector 24 is released from the motherboard connector 22 allowing the card to be slid out of the housing on the card guide slides 18*a*.

It will thus be seen that the objects set forth above, among those made apparent from the preceding description, are efficiently attained. Also, certain changes may be made in the above constructions without departing from the scope of the invention. Therefore, it is intended that all matter contained in the above description or shown in the accompanying drawings shall be interpreted as illustrative and not in a limiting sense.

It is also to be understood that the following claims are intended to cover all of the generic and specific features of the invention described herein.

What is claimed is:

1. An injector/ejector mechanism including a printed circuit card, that has front, rear and opposite side edges, a face plate at the front edge and a connector at the rear edge and which slides on guides adjacent to the side edges of the cards to a home position inside a chassis which connects said connector to a mating connector on a motherboard in the chassis, said mechanism comprising a dog having spaced-apart first and second lobes;

pivot means pivotally connecting the dog to the card adjacent to the front edge thereof whereby the dog can pivot parallel to the card, said dog being pivotable between a first position wherein the first dog lobe overhangs the card side edge and engages a first surface of the card guide when the card is not in said home position and a second position wherein the second lobe overhangs the card slide edge and engages a second surface of the card guide behind the first surface when the card is in said home position, and moving means for pivoting the dog between said first and second positions.

2. The mechanism defined in claim 1 wherein the moving means comprise a lever arm;

mounting means for pivotally mounting the lever arm to said face plate so that the lever arm can swing parallel to the card, and a link linking the lever arm and the dog so that the swinging of the lever arm moves the dog between said first and second positions.

3. A mechanism defined in claim 2 wherein said dog is a flat plate.

4. The mechanism defined in claim 2 wherein said dog and said lever arm are located on opposite sides of the face plate, and said link extends through a small hole in the face plate.

5. The mechanism defined in claim 4 and further including at least one fastener extending through said face plate for fastening to said card guide when the card is in said home position.

6. The mechanism defined in claim 4 wherein the mounting means comprise a pair of spaced-apart parallel ears projecting from the face plate away from said card;

said lever arm has opposite ends and is pivotally mounted between said ears, and said link is pivotally connected to one end of said lever arm, the opposite end of said link being pivotally connected to the first lobe of the dog.

\* \* \* \* \*